United States Patent
Ji et al.

(10) Patent No.: US 8,482,422 B2
(45) Date of Patent: Jul. 9, 2013

(54) THIN FILM DEPOSITION APPARATUS AND METHOD OF MANUFACTURING ORGANIC LIGHT-EMITTING DISPLAY DEVICE BY USING THIN FILM DEPOSITION APPARATUS

(75) Inventors: Chang-Soon Ji, Yongin (KR); Tae-Seung Kim, Yongin (KR); Jong-Woo Lee, Yongin (KR); Chengguo An, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/437,848

(22) Filed: Apr. 2, 2012

(65) Prior Publication Data

US 2012/0186517 A1 Jul. 26, 2012

Related U.S. Application Data

(62) Division of application No. 12/962,910, filed on Dec. 8, 2010, now Pat. No. 8,173,481.

(30) Foreign Application Priority Data

Dec. 15, 2009 (KR) .................. 10-2009-0125029

(51) Int. Cl.
*G08B 21/00* (2006.01)

(52) U.S. Cl.
USPC .... 340/649; 340/635; 340/650; 257/E21.018; 257/E21.022; 257/E21.095; 257/E21.299; 257/E21.527; 118/500; 118/721

(58) Field of Classification Search
USPC .......... 257/E21.018, E21.527, E21.022, 257/E21.095, E21.299; 340/635, 649–650; 118/500, 721
See application file for complete search history.

(56) References Cited

U.S. PATENT DOCUMENTS

| | | | |
|---|---|---|---|
| 5,450,277 A * | 9/1995 | Wescott et al. ............... | 361/220 |
| 2005/0095754 A1 | 5/2005 | Choi | |
| 2006/0082640 A1* | 4/2006 | Chin et al. ..................... | 347/238 |
| 2009/0079572 A1* | 3/2009 | Atsumi et al. .............. | 340/572.7 |
| 2010/0136767 A1* | 6/2010 | Hwang et al. ................. | 438/468 |
| 2010/0200851 A1 | 8/2010 | Oikawa et al. | |
| 2010/0273276 A1 | 10/2010 | Lee et al. | |

FOREIGN PATENT DOCUMENTS

| | | |
|---|---|---|
| JP | 2005-235568 | 9/2005 |
| JP | 2009-140903 | 6/2009 |
| KR | 20-0257219 | 11/2001 |
| KR | 10-2003-0047284 | 6/2003 |
| KR | 10-2004-0042160 | 5/2004 |
| KR | 10-2004-0063326 | 7/2004 |
| KR | 10-2005-0042963 | 5/2005 |
| KR | 10-2006-0033554 | 4/2006 |
| KR | 10-2007-0016878 | 2/2007 |
| KR | 10-2007-0016878 A | 2/2007 |
| KR | 10-2008-0100051 | 11/2008 |

OTHER PUBLICATIONS

Chun, English Machine Translated of KR Publication No. 1020060033554, Aug. 2, 2007; (Machine Translated Sep. 30, 2012).*
Korean Office Action dated May 18, 2012 issued in Korean Priority Application KR 10-2009-0125029, 5 pages.
KIPO Office action dated Mar. 28, 2011, for Korean priority Patent application 10-2009-0125029.

\* cited by examiner

*Primary Examiner* — Mohsen Ahmadi
(74) *Attorney, Agent, or Firm* — Christie, Parker & Hale, LLP

(57) ABSTRACT

A thin film deposition apparatus to remove static electricity generated between a substrate and a mask, and a method of manufacturing an organic light-emitting display device using the thin film deposition apparatus.

2 Claims, 4 Drawing Sheets

THIN FILM DEPOSITION APPARATUS AND METHOD OF MANUFACTURING ORGANIC LIGHT-EMITTING DISPLAY DEVICE BY USING THIN FILM DEPOSITION APPARATUS

CROSS-REFERENCE TO RELATED APPLICATION

This application is a divisional of U.S. patent application Ser. No. 12/962,910, filed Dec. 8, 2010, which claims priority to and the benefit of Korean Patent Application No. 10-2009-0125029, filed Dec. 15, 2009, the entire content of both of which is incorporated herein by reference.

BACKGROUND

1. Field

The present disclosure relates to a thin film deposition apparatus to remove static electricity generated between a substrate and a mask, and a method of manufacturing an organic light-emitting display device using the thin film deposition apparatus.

2. Description of the Related Art

Organic light-emitting display devices have a larger viewing angle, better contrast characteristics, and a faster response rate than other display devices and thus, have drawn attention as the next-generation of display device.

In general, organic light-emitting display devices have a stacked structure including an anode, a cathode, and an emission layer interposed between the anode and the cathode, Organic light-emitting display devices display color images when holes and electrons, injected respectively from the anode and the cathode, recombine in the emission layer and emit light. However, it is difficult to achieve a high light-emission efficiency with such a structure. Thus, intermediate layers, including an electron injection layer, an electron transport layer, a hole transport layer, a hole injection layer, etc., are additionally interposed between the emission layer and each of the electrodes.

The electrodes and the intermediate layers may be formed by using various methods, one of which is a deposition method. When an organic light-emitting display device is manufactured using the deposition method, a fine metal mask (FMM), having the same pattern as a thin film to be formed, is disposed to closely contact a substrate, and a thin film material is deposited over the FMM, in order to form the thin film having the desired pattern.

SUMMARY

The present disclosure provides a thin film deposition apparatus that removes static electricity generated between a substrate and a mask, so that a phenomenon in which the mask and the substrate are not separated, due to the static electricity, does not occur, and a method of manufacturing an organic light-emitting display device by using the thin film deposition apparatus.

According to an aspect of the present disclosure, there is provided a thin film deposition apparatus including: a holder to support a substrate; a mask disposed to face a surface of the substrate; and a static electricity remover to remove static electricity generated between the substrate and the mask.

According to some aspects, the static electricity remover may remove the static electricity generated between the substrate and the mask, by supplying a current to the mask.

According to some aspects, the static electricity remover may supply the current to the mask at a predetermined frequency.

According to some aspects, the static electricity remover may include a power source to supply a current to the mask; a resistor to adjust the amount of the current; and a wire connected to the power source, the resistor, and the mask, so as to constitute a closed circuit.

According to another aspect of the present disclosure, there is provided a method of manufacturing an organic light-emitting device including first and second electrodes formed on a substrate and facing each other, and an organic layer disposed between the first and second electrodes, the method including: disposing the substrate in a chamber; positioning a mask so as to face a surface of the substrate; depositing the organic layer on the substrate through the mask; removing static electricity generated between the mask and the substrate; and separating the mask and the substrate from each other.

According to some aspects, the removing of the static electricity may include supplying a current to the mask.

According to some aspects, the removing of the static electricity may include supplying the current to the mask at a predetermined frequency.

According to some aspects, the removing of the static electricity may include supplying the current to the mask, wherein the mask, a power source to supply the current to the mask, and a resistor to adjusting the amount of the current, constitute a closed circuit.

Additional aspects and/or advantages of the disclosure will be set forth in part in the description which follows and, in part, will be obvious from the description, or may be learned by practice of the present disclosure.

BRIEF DESCRIPTION OF THE DRAWINGS

These and/or other aspects and advantages of the present disclosure will become apparent and more readily appreciated from the following description of the exemplary embodiments, taken in conjunction with the accompanying drawings, of which.

DETAILED DESCRIPTION

Figure 1:
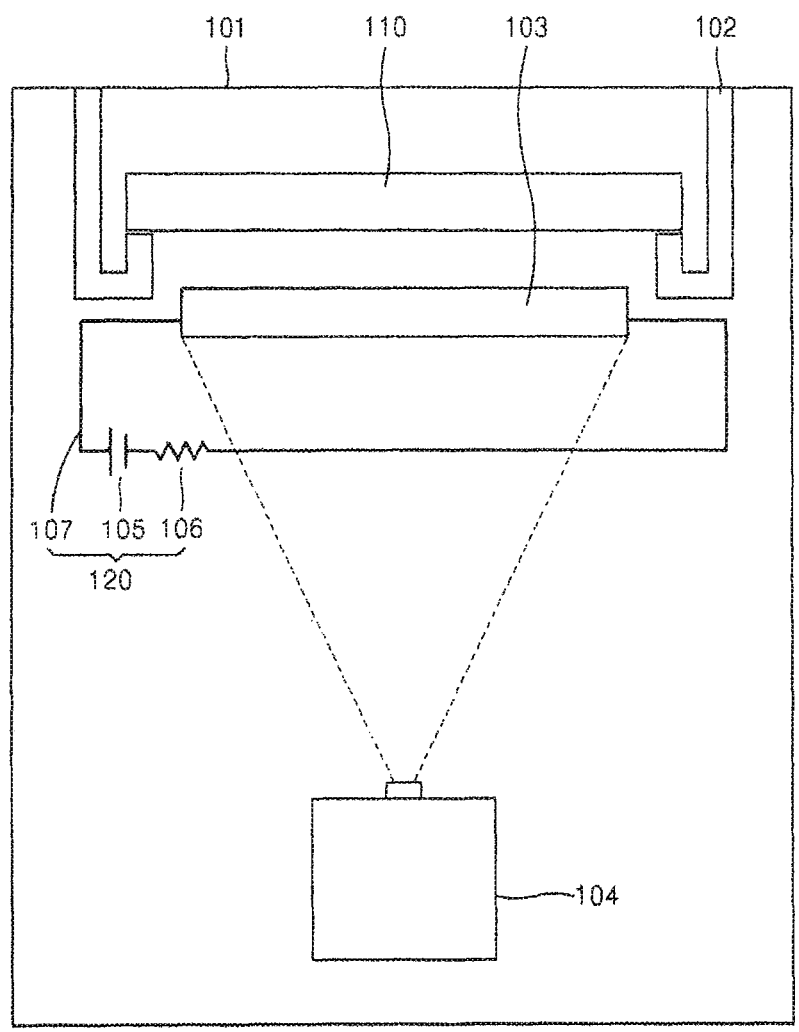
FIG. 1 is a schematic cross-sectional view of a thin film deposition apparatus, according to an exemplary embodiment of the present disclosure.

Reference will now be made in detail to the exemplary embodiments of the present disclosure, examples of which are illustrated in the accompanying drawings, wherein like reference numerals refer to the like elements throughout. The exemplary embodiments are described below, in order to explain the aspects of the present disclosure, by referring to the figures.

Figure 2:
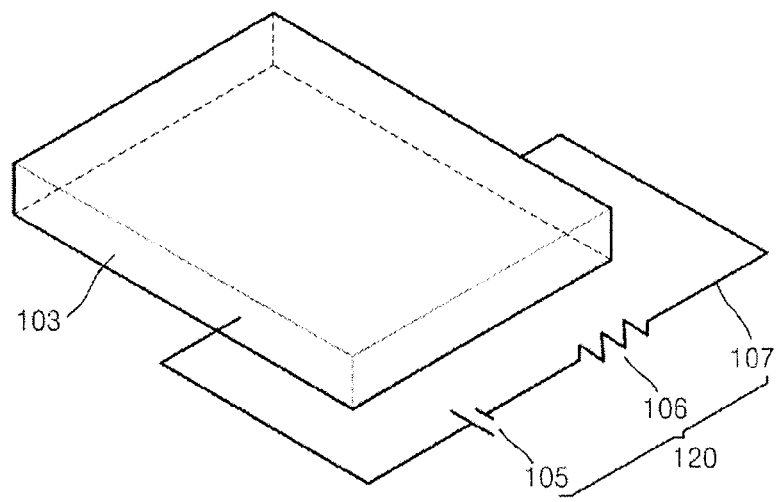
FIG. 2 is a schematic perspective view of a mask and a static electricity remover of FIG. 1, according to an exemplary embodiment of the present disclosure.

FIG. 1 is a schematic cross-sectional view of a thin film deposition apparatus 100, according to an exemplary embodiment of the present disclosure. FIG. 2 is a schematic perspective view of a mask 103 and a static electricity remover 120 of FIG. 1.

Referring to FIGS. 1 and 2, the thin film deposition apparatus 100 may include a chamber 101, a holder 102, the mask 103, a deposition source 104, and the static electricity remover 120. In the chamber 101, the holder 102, the mask 103, the deposition source 104, and the static electricity remover 120 may be placed, and a thin film deposition process may be performed. The chamber 101 may be maintained in a vacuum during the thin film deposition process.

The holder 102 fixedly supports the substrate 110 in the chamber 101, during the thin film deposition process. As illustrated in FIG. 1, the holder 102 may support edge portions of the substrate 110, so that a thin film 108 (see FIG. 3) may be deposited on a central portion of the substrate 110. The substrate 110 may be a substrate for a flat panel display apparatus, or alternatively, may be a large-sized substrate, such as a mother glass on which a plurality of flat panel display apparatuses may be formed.

The deposition source 104 may be disposed opposite to the substrate 110, in the chamber 101. The deposition source 104 may accommodate a deposition material (not shown) therein, and may heat the deposition material. The heating vaporizes the deposition material, which is then deposited on the substrate 110 as a thin film 108.

The mask 103 includes a plurality of openings (not shown), and is disposed between the substrate 110 and the deposition source 104, so as to pattern the thin film 108 according to the openings. That is, the deposition material vaporized by the deposition source 104 passes through the openings of the mask 103 and is deposited on a surface of the substrate 110, to form the thin film 108. The greater the distance between the substrate 110 and the mask 103, the more a shadow phenomenon occurs. In order to prevent the shadow phenomenon, the substrate 110 and the mask 103 may be attached as closely as possible. The openings of the mask 103 may be a plurality of slits or dots (holes), but the present disclosure is not limited thereto.

The static electricity remover 120 may remove static electricity from between the substrate 110 and the mask 103. The mask 103 and the substrate 110 are aligned many times, in order to deposit the thin film 108 in a desired position. In addition, in a case of an organic light-emitting display device, since organic layers for emitting red, green, and blue light are formed on a substrate, various masks for the respective colors are used. An alignment operation is performed whenever different masks are used. The substrate 110 and the mask 103 may be aligned by adjusting an arrangement between the mask 103 and the substrate 110. In this case, the mask 103 and the substrate 110 may be repeatedly brought into and out of contact with each other. Thus, static electricity may be generated between the mask 103 and the substrate 110. The substrate 110 and the mask 103 may be adhered to each other, due to the static electricity. Thus, a portion of the substrate 110 may be damaged by the adhesion.

Figure 3:
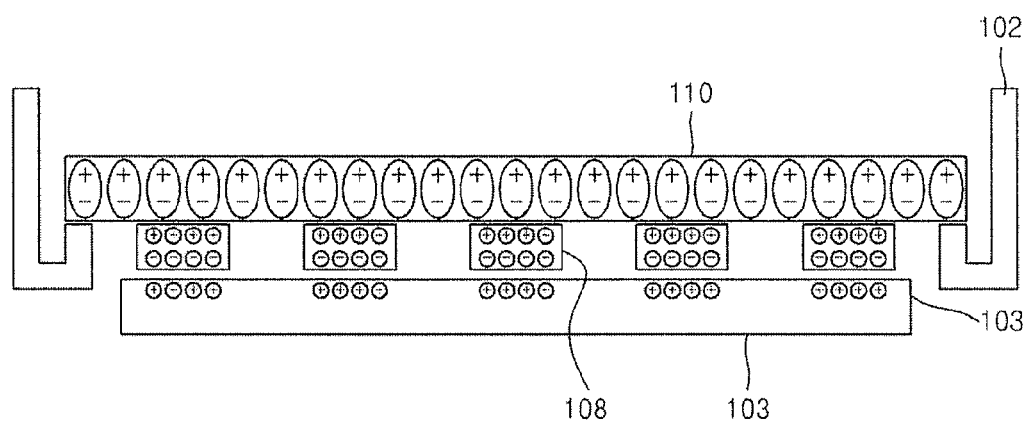
FIGS. 3 through 5 are cross-sectional views for illustrating a function of the thin film deposition apparatus, according to an exemplary embodiment of the present disclosure.
Figure 4:
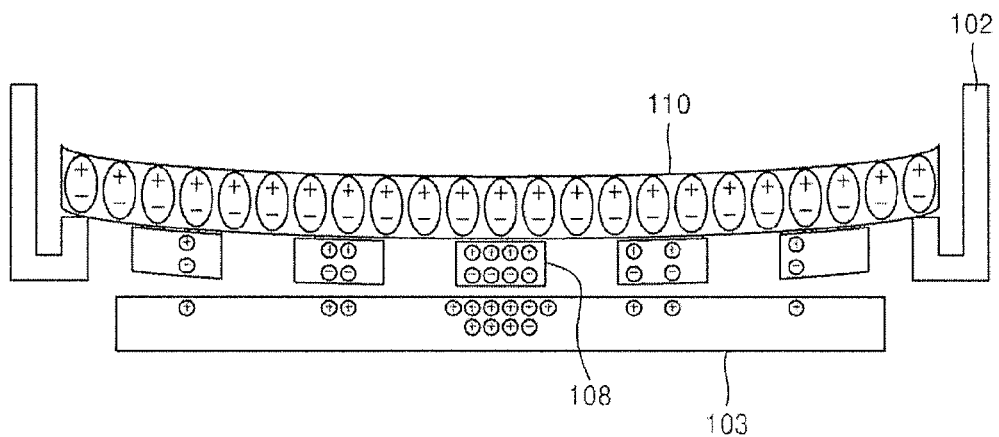

The above-described problem will now be described with reference to FIGS. 3 and 4. As shown in FIG. 3, static electricity may be generated between the mask 103, the substrate 110, and a thin film 108, due to an alignment operation between the mask 103 and the substrate 110, and the replacement of various masks. Thus, the mask 103, the substrate 110, and the thin film 108 contact each other, and the substrate 110 and the mask 103 are closely attached. Then, as shown in FIG. 4, when the substrate 110 is raised after a thin film deposition process is finished, a portion of the substrate 110 may not be properly separated from the mask 103. Thus, the substrate 110 may be damaged, or a portion of the thin film 108 deposited on the substrate 110 may be separated from the substrate 110.

Figure 5:
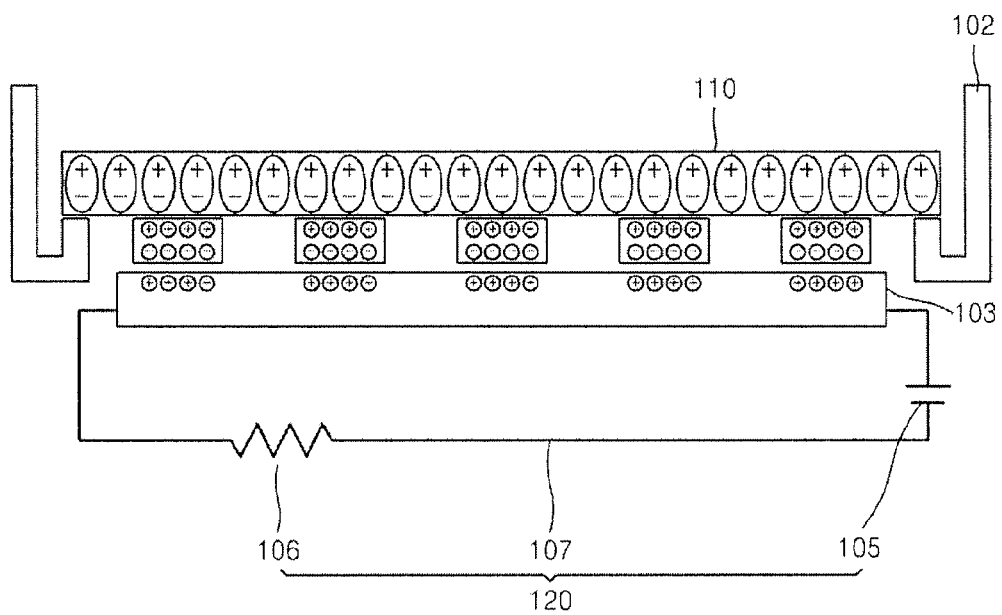

As shown in FIG. 5, the static electricity remover 120 connected to the mask 103 may remove the static electricity generated between the substrate 110 and the mask 103, thereby preventing the substrate 110 from being damaged when the substrate 110 and the mask 103 are separated from each other. The static electricity remover 120 may include, for example, a power source 105 to supply current to the mask 103, a resistor 106 to adjust the amount of the current, and a conductive wire 107 constituting a closed circuit, connecting the power source 105, the resistor 106, and the mask 103. The current may be intermittently supplied to the mask 103, at a predetermined frequency. In other words, although not required in all aspects of the present invention, the current is supplied to the mask for a predetermined amount of time at a predetermined frequency, and the current may be not supplied to the mask for another predetermined amount of time.

As shown in FIG. 2, the static electricity remover 120 may be disposed next to the mask 103, since the deposition material emitted from the deposition source 104 passes through upper and lower surfaces of the mask 103, to be deposited on the substrate 110.

Figure 6:
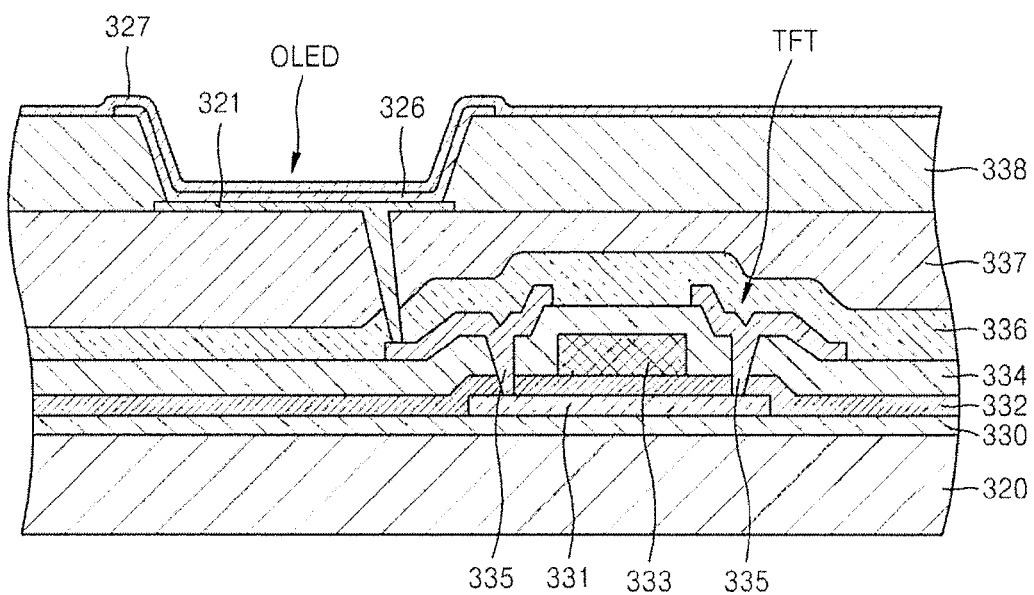
FIG. 6 is a cross-sectional view of an organic light-emitting display device manufactured using a thin film deposition device, according to an exemplary embodiment of the present disclosure.

FIG. 6 is an organic light-emitting display device manufactured with a thin film deposition apparatus, according to an exemplary embodiment of the present disclosure. In FIG. 6, a single sub-pixel of an active matrix (AM) type organic light-emitting display device is illustrated. Referring to FIG. 6, the single sub-pixel includes at least one thin-film transistor (TFT) and an electroluminescence (EL) device (e.g., an organic light-emitting diode), which is a self-emissive device. However, the TFT is not limited to the structure of FIG. 6, as the TFT may include various structures. The AM type organic light-emitting display device will now be described in more detail.

As shown in FIG. 6, a buffer layer 330 is formed on a substrate 320, and the TFT is formed on the buffer layer 330. The TFT includes a semiconductor active layer 331, a gate insulating layer 332 formed to cover the semiconductor active layer 331 and the buffer layer 330, and a gate electrode 333 formed on the gate insulating layer 332. An interlayer insulating layer 334 is formed to cover the gate electrode 333, and source and drain electrodes 335 are formed on the interlayer insulating layer 334. The source and drain electrodes 335 contact source and drain regions of the semiconductor active layer 331, respectively, via contact holes formed through the gate insulating layer 332 and the interlayer insulating layer 334. A first electrode layer 321 operating as an anode of an OLED is connected to the source and drain electrodes 335. The first electrode layer 321 is formed on a planarization layer 337. A pixel defining layer 338 is formed to cover the first electrode layer 321. An opening is formed in the pixel defining layer 338, and an organic layer 326 of the OLED is formed in the opening. A second electrode layer 327 operating as a common electrode is formed to cover the first electrode layer 321 and the opening.

The organic layer 326 of the OLED may include red (R), green (G), and blue (B) organic emissive layers, to thereby realize a full color display. The R, G, and B organic emissive layers may be formed by the thin film deposition apparatus. The R, G, and B organic emissive layers may be formed using respective masks. After the R, G, and B organic emissive layers are deposited, static electricity generated between a substrate and a mask is removed by a static electricity remover of the thin film deposition apparatus, and then the substrate and the mask are separated from each other.

The organic light-emitting display device is sealed, so as to prevent external oxygen and moisture from penetrating into the organic light-emitting display device. The organic light-emitting display device is for illustrative purposes only, and the structure of the organic light-emitting display device may be variously changed.

According to various embodiments of the present disclosure, static electricity generated between a mask and a substrate may be removed, thereby preventing a phenomenon in which the mask and the substrate are not separated, due to the static electricity.

Although a few exemplary embodiments of the present disclosure have been shown and described, it would be appreciated by those skilled in the art that changes may be made in these exemplary embodiments, without departing from the principles and spirit of the present disclosure, the scope of which is defined in the claims and their equivalents.

What is claimed is:

1. A thin film deposition apparatus comprising:
   a holder configured to support a substrate; and
   a static electricity remover connected to a mask to remove static electricity generated between the substrate and the mask, the mask being arranged to face a surface of the substrate;
   wherein the static electricity remover is configured to remove static electricity by supplying a current to the mask at a predetermined frequency;
   wherein the static electricity remover comprises:
   a power source configured to supply current to the mask;
   a resistor configured to adjust an amount of the current; and
   a wire connected to the power source, the resistor, and the mask, to form a closed circuit.

2. The thin film deposition apparatus of claim 1, wherein the static electricity remover is configured to supply current to the mask for a predetermined amount of time.

* * * * *